United States Patent
Park et al.

(10) Patent No.: US 9,679,621 B2
(45) Date of Patent: Jun. 13, 2017

(54) SEMICONDUCTOR DEVICE AND SEMICONDUCTOR SYSTEM

(71) Applicant: SK hynix Inc., Icheon-si, Gyeonggi-do (KR)

(72) Inventors: Min Soo Park, Uiwang-si (KR); Jin Se Kim, Icheon-si (KR); Moon Yub Na, Icheon-si (KR); Min Jun Choi, Icheon-si (KR); Hyun Wook Han, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 15/017,994

(22) Filed: Feb. 8, 2016

(65) Prior Publication Data

US 2017/0117023 A1    Apr. 27, 2017

(30) Foreign Application Priority Data

Oct. 27, 2015    (KR) ........................ 10-2015-0149657

(51) Int. Cl.
| | |
|---|---|
| *G11C 7/10* | (2006.01) |
| *G11C 7/06* | (2006.01) |
| *G11C 8/10* | (2006.01) |
| *G11C 7/12* | (2006.01) |

(52) U.S. Cl.
CPC .............. *G11C 7/1063* (2013.01); *G11C 7/06* (2013.01); *G11C 7/10* (2013.01); *G11C 7/1057* (2013.01); *G11C 7/1084* (2013.01); *G11C 7/12* (2013.01); *G11C 8/10* (2013.01)

(58) Field of Classification Search
CPC ... G11C 7/1051; G11C 7/1078; G11C 7/1087; G11C 7/1057
USPC ........................ 365/189.05, 185.03
See application file for complete search history.

(56) References Cited

U.S. PATENT DOCUMENTS

2006/0106969 A1*   5/2006   Hoogerbrugge .... G06F 13/1631
                                                                    711/1
2014/0281285 A1       9/2014   Tanaka

FOREIGN PATENT DOCUMENTS

KR         1020120084180 A          7/2012

* cited by examiner

*Primary Examiner* — Huan Hoang
(74) *Attorney, Agent, or Firm* — William Park & Associates Ltd.

(57)    ABSTRACT

A semiconductor system may include a first semiconductor device configured to output commands, addresses and data. The semiconductor system may include a second semiconductor device configured to convert a logic level combination of the data when only any one of bits of the data is a different logic level, and store the data in response to the commands and the addresses, in a write operation.

21 Claims, 11 Drawing Sheets

SEMICONDUCTOR DEVICE AND SEMICONDUCTOR SYSTEM

CROSS-REFERENCE TO RELATED APPLICATION

The present application claims priority under 35 U.S.C. §119(a) to Korean Patent Application No. 10-2015-0149657, filed on Oct. 27, 2015, in the Korean Intellectual Property Office, which is incorporated herein by reference in its entirety.

BACKGROUND

1. Technical Field

Embodiments of the present disclosure generally relate to a semiconductor device and a semiconductor system, and, more particularly, to a semiconductor device and a semiconductor system which input and output data by converting a logic level combination thereof.

2. Related Art

In general, a semiconductor device includes a plurality of memory cells. The semiconductor device including the memory cells may perform a write operation and a read operation to store data in the memory cells and to output data stored in the memory cells to an exterior. The write operation or the read operation can be performed in accordance with control from a controller.

As semiconductor systems trend towards higher performance, a volatile memory device such as a DRAM mounted as a memory trends toward higher operation speeds and higher degrees of integration. Therefore, as semiconductor processes are developed, the capacity and the operation speed of a memory chip are being gradually increased. As semiconductor processes become finer, the size of memory cells in a memory chip and the width of lines through which data or internal signals are transmitted are gradually decreasing.

In this way, as the size of memory cells disposed in a semiconductor device and the width of lines through which data are transmitted decrease, interference between data bits increases. Therefore, it is necessary to make an effort to lessen an interference phenomenon such as an inter-symbol interference phenomenon and an inter-channel interference phenomenon that occurs by interference between data bits.

SUMMARY

Various embodiments are direct to a semiconductor device and a semiconductor system capable of writing data by converting a logic level combination thereof in the case where only any one among bits of the data is a different logic level and recovering the logic level combination of the data in a read operation, thereby lessening an interference phenomenon between data bits.

Also, various embodiments are direct to a semiconductor device and a semiconductor system capable of writing data by converting a logic level combination thereof in the case where only any one among bits of the data is a different logic level and outputting the data in a read operation by recovering the logic level combination of the data, thereby lessening an inter-symbol interference phenomenon and an inter-channel interference phenomenon.

In an embodiment, a semiconductor system may include: a first semiconductor device configured to output commands, addresses and data; and a second semiconductor device configured to convert a logic level combination of the data in response to a flag signal which is enabled in the case where only any one of bits of the data is a different logic level, and store the data in response to the commands and the addresses, in a write operation.

In an embodiment, a semiconductor device may include: a data input/output block configured to output data inputted from an exterior, to input/output lines, in a write operation, and output internal data loaded on the input/output lines, as the data, in a read operation; and a pattern control block configured to output the data loaded on the input/output lines to global lines by converting a logic level combination of the data, in response to a flag signal which is enabled in the case where only any one of bits of the data is a different logic level, and output the internal data loaded on the global lines to the input/output lines by recovering a logic level combination of the internal data, in the read operation.

According to the embodiments, it is possible to write data by converting a logic level combination thereof in the case where only any one among bits of the data is a different logic level and output the data in a read operation by recovering the logic level combination of the data, thereby lessening an interference phenomenon between data bits.

Also, according to the embodiments, it is possible to write data by converting a logic level combination thereof in the case where only any one among bits of the data is a different logic level and outputting the data in a read operation by recovering the logic level combination of the data, thereby lessening an interference phenomenon such as an inter-symbol interference phenomenon and an inter-channel interference phenomenon.

DETAILED DESCRIPTION

Hereinafter, a semiconductor device and a semiconductor system will be described below with reference to the accompanying drawings through various examples of embodiments.

Figure 1:
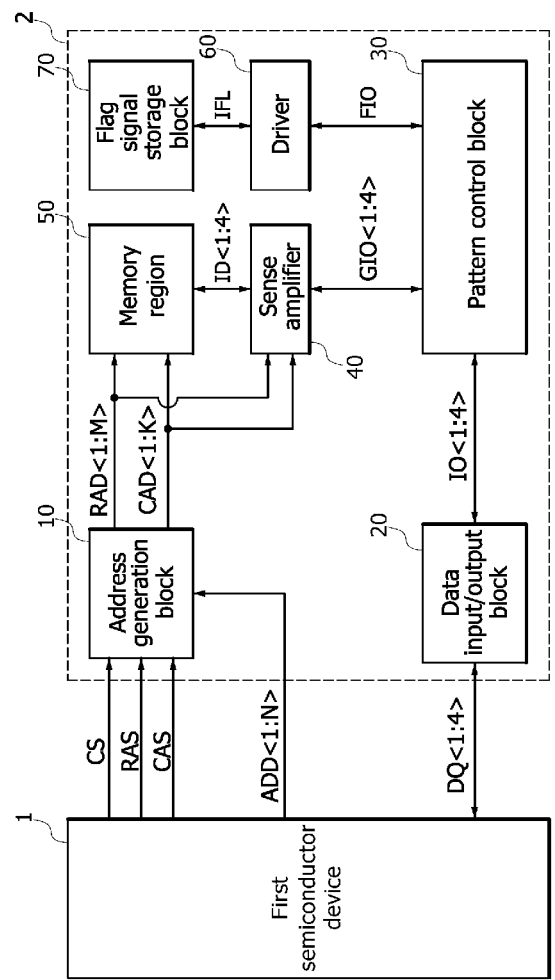
FIG. 1 is a block diagram illustrating a representation of an example of the configuration of a semiconductor system in accordance with an embodiment.

Referring to FIG. 1, a semiconductor system in accordance with an embodiment may include a first semiconductor device 1 and a second semiconductor device 2. The second semiconductor device 2 may include an address generation block 10, a data input/output block 20, a pattern control block 30, a sense amplifier 40, a memory region 50, a driver 60, and a flag signal storage block 70.

The first semiconductor device 1 may output commands CS, RAS and CAS, first to $N^{th}$ addresses ADD<1:N>, and first to fourth data DQ<1:4>. The first semiconductor device 1 may receive first to fourth data DQ<1:4>. The commands CS, RAS and CAS may be transmitted through lines through which at least ones of addresses, commands and data are transmitted. Also, the commands CS, RAS and CAS may be successively transmitted through one line. The command CS may be set as a command or a signal for selecting a semiconductor device which performs input/output of data. The command RAS may be set as a command or a signal for strobing an address to be used in a row path of the memory of the semiconductor device. The command CAS may be set as a command or a signal for strobing an address to be used in a column path of the memory of the semiconductor device. The numbers of the bits of the first to $N^{th}$ addresses ADD<1:N> and the first to fourth data DQ<1:4> may be set variously according to embodiments.

The first semiconductor device 1 may be realized as a controller for controlling the operation of the second semiconductor device 2 or a test equipment for testing the second semiconductor device 2. The first semiconductor device 1 may control the operation of the second semiconductor device 2 for inputting/outputting the first to fourth data DQ<1:4> according to the commands CS, RAS and CAS and the first to $N^{th}$ addresses ADD<1:N>.

The address generation block 10 may decode the commands CS, RAS and CAS and the first to $N^{th}$ addresses ADD<1:N>, and may generate first to $M^{th}$ row addresses RAD<1:M> and first to $K^{th}$ column addresses CAD<1:K>. The address generation block 10 may decode the first to $N^{th}$ addresses ADD<1:N> and generate the first to $M^{th}$ row addresses RAD<1:M>, in the case where the command CS and the command RAS are inputted. The address generation block 10 may decode the first to $N^{th}$ addresses ADD<1:N> and generate the first to $K^{th}$ column addresses CAD<1:K>, in the case where the command CS and the command CAS are inputted.

The data input/output block 20 may be inputted with the first to fourth data DQ<1:4> and output them to first to fourth input/output lines IO<1:4>, in a write operation. The data input/output block 20 may output first to fourth internal data ID<1:4> loaded on the first to fourth input/output lines IO<1:4>, as the first to fourth data DQ<1:4>, in a read operation. The first to fourth input/output lines IO<1:4> through which the first to fourth data DQ<1:4> are inputted/outputted may be set to various numbers to correspond to the numbers of the bits of data, and the first to fourth data DQ<1:4> may be inputted/outputted in series through any one of the first to fourth input/output lines IO<1:4>.

In the write operation, the pattern control block 30 may convert a logic level combination of the first to fourth data DQ<1:4> in response to a flag signal FLAG (see FIG. 2) which is enabled in the case where only any one among the bits of the first to fourth data DQ<1:4> loaded on the first to fourth input/output lines IO<1:4> is different, and output a converted logic level combination of the first to fourth data DQ<1:4> to first to fourth global lines GIO<1:4>. In the write operation, the pattern control block 30 may not convert a logic level combination of the first to fourth data DQ<1:4> in response to the flag signal FLAG which is disabled, and output the non-converted logic level combination of the first to fourth data DQ<1:4> to the first to fourth global lines GIO<1:4>. In the read operation, the pattern control block 30 may convert a logic level combination of the first to fourth internal data ID<1:4> loaded on the first to fourth global lines GIO<1:4>, in response to an internal flag signal IFL loaded on a flag line FIO, and output a converted logic level combination of the first to fourth internal data ID<1:4> to the first to fourth input/output lines IO<1:4>. In the read operation, the pattern control block 30 may not convert a logic level combination of the first to fourth internal data ID<1:4> in response to the internal flag signal IFL loaded on the flag line FIO, and output the non-converted logic level combination of the first to fourth internal data ID<1:4> to the first to fourth input/output lines IO<1:4>.

The sense amplifier 40 may generate the first to fourth internal data ID<1:4> in response to the first to fourth data DQ<1:4> loaded on the first to fourth global lines GIO<1:4> according to the first to $M^{th}$ row addresses RAD<1:M> and the first to $K^{th}$ column addresses CAD<1:K> in the write operation. The sense amplifier 40 may output the first to fourth internal data ID<1:4> to the first to fourth global lines GIO<1:4> according to the first to $M^{th}$ row addresses RAD<1:M> and the first to $K^{th}$ column addresses CAD<1:K> in the read operation. The sense amplifier 40 may be realized to include a plurality of sense amplifiers which are selected according to the first to $M^{th}$ row addresses RAD<1:M> and the first to $K^{th}$ column addresses CAD<1:K>.

The memory region 50 may store the first to fourth internal data ID<1:4> in memory cells selected according to the first to $M^{th}$ row addresses RAD<1:M> and the first to $K^{th}$ column addresses CAD<1:K> in the write operation. The memory region 50 may output the first to fourth internal data ID<1:4> stored in memory cells selected according to the first to $M^{th}$ row addresses RAD<1:M> and the first to $K^{th}$ column addresses CAD<1:K> in the read operation.

The driver 60 may generate the internal flag signal IFL in response to the flag signal FLAG inputted through the flag line FIO in the write operation. The driver 60 may output the internal flag signal IFL to the flag line FIO in the read operation.

The flag signal storage block 70 may store the internal flag signal IFL in the write operation. The flag signal storage block 70 may output the stored internal flag signal IFL in the read operation. The flag signal generation block 70 may be realized by a memory cell array, the same as the memory region 40 or a fuse array including a plurality of fuses, according to an embodiment.

As a consequence, the second semiconductor device 2 may store the first to fourth data DQ<1:4> by converting a logic level combination thereof in response to the flag signal FLAG which is enabled in the case where only any one among the bits of the first to fourth data DQ<1:4> is different, in the write operation. The second semiconductor device 2 may store the first to fourth data DQ<1:4> by not converting a logic level combination thereof in response to the flag signal FLAG which is disabled, in the write operation. The second semiconductor device 2 may output the first to fourth data DQ<1:4> by converting a logic level combination of the first to fourth internal data ID<1:4> in response to the internal flag signal IFL which is enabled, in the read operation. The second semiconductor device 2 may output the first to fourth data DQ<1:4> by not converting a logic level combination of the first to fourth internal data ID<1:4> in response to the internal flag signal IFL which is disabled, in the read operation.

Figure 2:
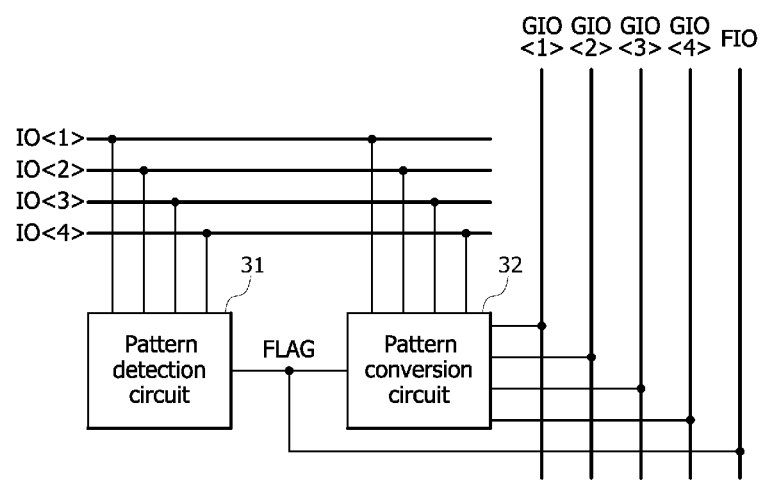
FIG. 2 is a block diagram illustrating a representation of an example of the configuration of the pattern control block included in the semiconductor system illustrated in FIG. 1.

Referring to FIG. 2, the pattern control block 30 in accordance with an embodiment may include a pattern detection circuit 31 and a pattern conversion circuit 32.

The pattern detection circuit 31 may detect a logic level combination of the first to fourth data DQ<1:4> loaded on the first to fourth input/output lines IO<1:4>, and generate the flag signal FLAG which is enabled in the case where only any one among the bits of the first to fourth data DQ<1:4> is a different level. The pattern detection circuit 31 may output the flag signal FLAG to the flag line FIO.

In the write operation, the pattern conversion circuit 32 may convert a logic level combination of the first to fourth data DQ<1:4> loaded on the first to fourth input/output lines IO<1:4>, in response to the flag signal FLAG, and output a converted logic level combination of the first to fourth data DQ<1:4> to the first to fourth global lines GIO<1:4>. In the write operation, the pattern conversion circuit 32 may not convert a logic level combination of the first to fourth data DQ<1:4> loaded on the first to fourth input/output lines IO<1:4>, in response to the flag signal FLAG, and output the non-converted logic level combination of the first to fourth data DQ<1:4> to the first to fourth global lines GIO<1:4>. In the read operation, the pattern conversion circuit 32 may convert a logic level combination of the first to fourth internal data ID<1:4> loaded on the first to fourth global lines GIO<1:4>, in response to the internal flag signal IFL loaded on the flag line FIO, and output a converted logic level combination of the first to fourth internal data ID<1:4> to the first to fourth input/output lines IO<1:4>. In the read operation, the pattern conversion circuit 32 may not convert a logic level combination of the first to fourth internal data ID<1:4> loaded on the first to fourth global lines GIO<1:4>, in response to the internal flag signal IFL loaded on the flag line FIO, and output the non-converted logic level combination of the first to fourth internal data ID<1:4> to the first to fourth input/output lines IO<1:4>.

Figure 3:
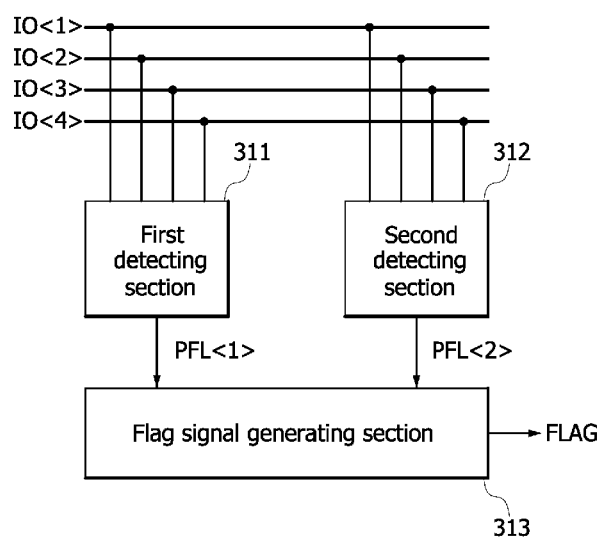
FIG. 3 is a block diagram illustrating a representation of an example of the configuration of the pattern detection circuit included in the pattern control block illustrated in FIG. 2.

Referring to FIG. 3, the pattern detection circuit 31 in accordance with an embodiment may include a first detecting section 311, a second detecting section 312, and a flag signal generating section 313.

The first detecting section 311 may generate a first pre-flag signal PFL<1> which is enabled in the case where only any one among the bits of the first to fourth data DQ<1:4> loaded on the first to fourth input/output lines IO<1:4> is a first logic level (a logic low level).

The second detecting section 312 may generate a second pre-flag signal PFL<2> which is enabled in the case where only any one among the bits of the first to fourth data DQ<1:4> loaded on the first to fourth input/output lines IO<1:4> is a second logic level (a logic high level).

The flag signal generating section 313 may generate the flag signal FLAG which is enabled in the case where any one of the first pre-flag signal PFL<1> and the second pre-flag signal PFL<2> is enabled. The flag signal generating section 313 may output the flag signal FLAG to the flag line FIO.

Figure 4:
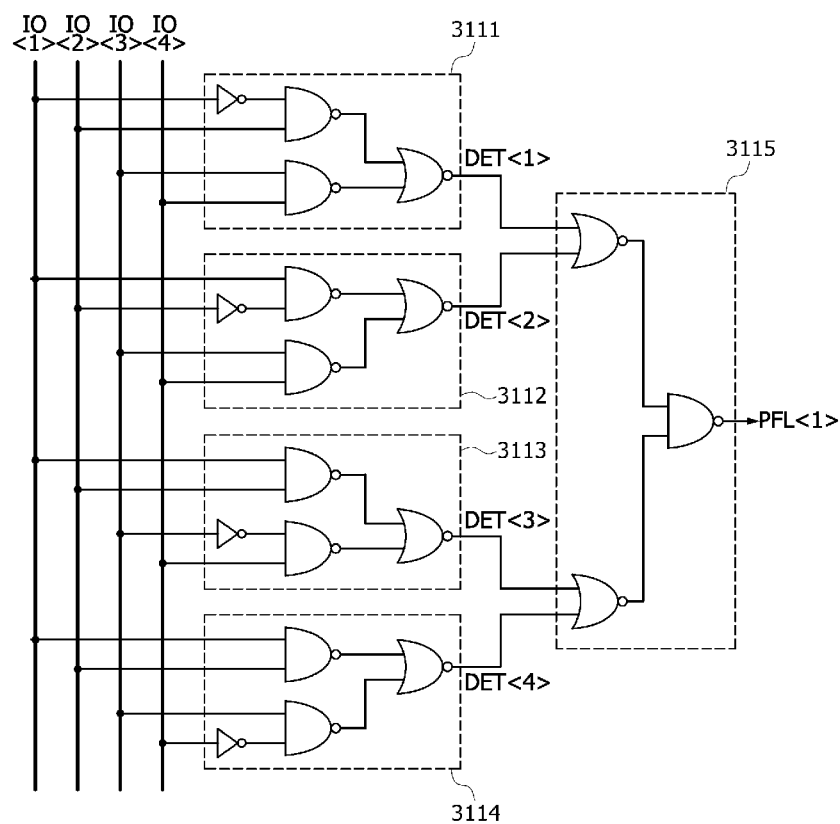
FIG. 4 is a circuit diagram illustrating a representation of an example of the configuration of the first detecting section included in the pattern detection circuit illustrated in FIG. 3.

Referring to FIG. 4, the first detecting section 311 in accordance with an embodiment may include first to fifth logic parts 3111 to 3115.

The first logic part 3111 may generate a first detection signal DET<1> which is enabled to a logic high level in the case where only the first data DQ<1> loaded on the first input/output line IO<1> among the first to fourth input/output lines IO<1:4> is the first logic level (the logic low level).

The second logic part 3112 may generate a second detection signal DET<2> which is enabled to a logic high level in the case where only the second data DQ<2> loaded on the second input/output line IO<2> among the first to fourth input/output lines IO<1:4> is the first logic level (the logic low level).

The third logic part 3113 may generate a third detection signal DET<3> which is enabled to a logic high level in the case where only the third data DQ<3> loaded on the third input/output line IO<3> among the first to fourth input/output lines IO<1:4> is the first logic level (the logic low level).

The fourth logic part 3114 may generate a fourth detection signal DET<4> which is enabled to a logic high level in the case where only the fourth data DQ<4> loaded on the fourth input/output line IO<4> among the first to fourth input/output lines IO<1:4> is the first logic level (the logic low level).

The fifth logic part 3115 may generate the first pre-flag signal PFL<1> which is enabled to a logic high level in the case where any one of the first to fourth detection signals DEC<1:4> is generated to the logic high level.

Figure 5:
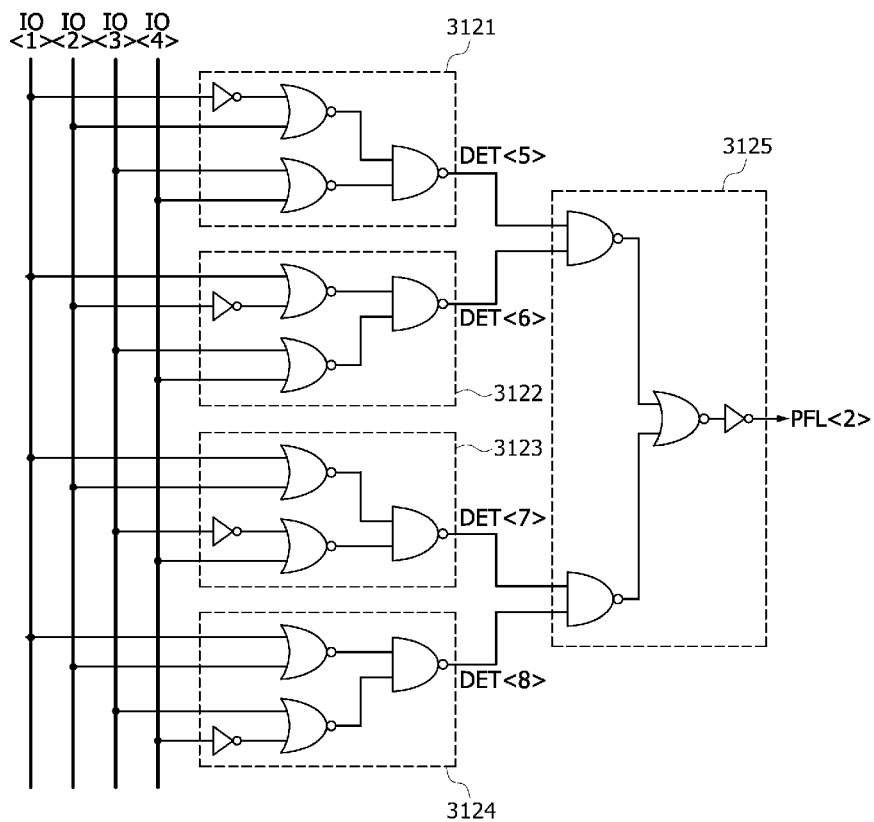
FIG. 5 is a circuit diagram illustrating a representation of an example of the configuration of the second detecting section included in the pattern detection circuit illustrated in FIG. 3.

Referring to FIG. 5, the second detecting section 312 in accordance with an embodiment may include sixth to tenth logic parts 3121 to 3125.

The sixth logic part 3121 may generate a fifth detection signal DET<5> which is enabled to a logic low level in the case where only the first data DQ<1> loaded on the first input/output line IO<1> among the first to fourth input/output lines IO<1:4> is the second logic level (the logic high level).

The seventh logic part 3122 may generate a sixth detection signal DET<6> which is enabled to a logic low level in the case where only the second data DQ<2> loaded on the second input/output line IO<2> among the first to fourth input/output lines IO<1:4> is the second logic level (the logic high level).

The eighth logic part 3123 may generate a seventh detection signal DET<7> which is enabled to a logic low level in the case where only the third data DQ<3> loaded on the third input/output line IO<3> among the first to fourth input/output lines IO<1:4> is the second logic level (the logic high level).

The ninth logic part 3124 may generate an eighth detection signal DET<8> which is enabled to a logic low level in the case where only the fourth data DQ<4> loaded on the fourth input/output line IO<4> among the first to fourth input/output lines IO<1:4> is the second logic level (the logic high level).

The tenth logic part 3125 may generate the second pre-flag signal PFL<2> which is enabled to a logic high level in the case where any one of the fifth to eighth detection signals DEC<5:8> is generated to the logic low level.

Figure 6:
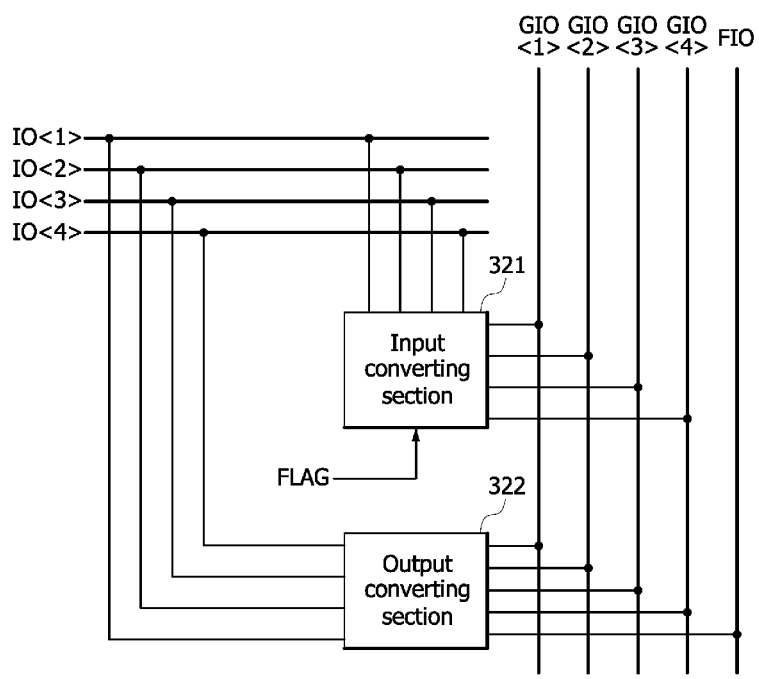
FIG. 6 is a block diagram illustrating a representation of an example of the configuration of the pattern conversion circuit included in the pattern control block illustrated in FIG. 2.

Referring to FIG. 6, the pattern conversion circuit 32 in accordance with an embodiment may include an input converting section 321 and an output converting section 322.

The input converting section 321 may convert a logic level combination of the first to fourth data DQ<1:4> loaded on the first to fourth input/output lines IO<1:4>, in response to the flag signal FLAG, and output a converted logic level combination of the first to fourth data DQ<1:4> to the first to fourth global lines GIO<1:4>, in the write operation. The input converting section 321 may not convert a logic level combination of the first to fourth data DQ<1:4> loaded on the first to fourth input/output lines IO<1:4>, in response to the flag signal FLAG, and output the non-converted logic level combination of the first to fourth data DQ<1:4> to the first to fourth global lines GIO<1:4>, in the write operation. The input converting section 321 may be realized not to be driven in the read operation.

The output converting section 322 may convert a logic level combination of the first to fourth internal data ID<1:4> loaded on the first to fourth global lines GIO<1:4>, in response to the internal flag signal IFL loaded on the flag line FIO, and output a converted logic level combination of the first to fourth internal data ID<1:4> to the first to fourth input/output lines IO<1:4>, in the read operation.

The output converting section 322 may not convert a logic level combination of the first to fourth internal data ID<1:4> loaded on the first to fourth global lines GIO<1:4>, in response to the internal flag signal IFL loaded on the flag line FIO, and output the non-converted logic level combination of the first to fourth internal data ID<1:4> to the first to fourth input/output lines IO<1:4>, in the read operation. The output converting section 322 may be realized not to be driven in the write operation.

Figure 7:
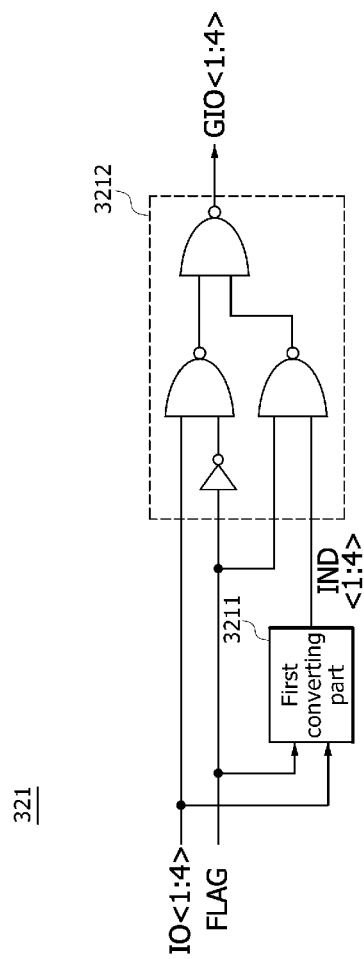
FIG. 7 is a diagram illustrating a representation of an example of the configuration of the input converting section included in the pattern conversion circuit illustrated in FIG. 6.

Referring to FIG. 7, the input converting section 321 in accordance with an embodiment may include a first converting part 3211 and a first buffer part 3212.

The first converting part 3211 may convert a logic level combination of the first to fourth data DQ<1:4> loaded on the first to fourth input/output lines IO<1:4>, in response to the flag signal FLAG, and generate first to fourth input data IND<1:4>.

The first buffer part 3212 may buffer the first to fourth data DQ<1:4> loaded on the first to fourth input/output lines IO<1:4> in the case where the flag signal FLAG is disabled to a logic low level, and output the buffered first to fourth data DQ<1:4> to the first to fourth global lines GIO<1:4>. The first buffer part 3212 may buffer the first to fourth input data IND<1:4> in the case where the flag signal FLAG is enabled to a logic high level, and output the buffered first to fourth input data IND<1:4> to the first to fourth global lines GIO<1:4>.

Figure 8:
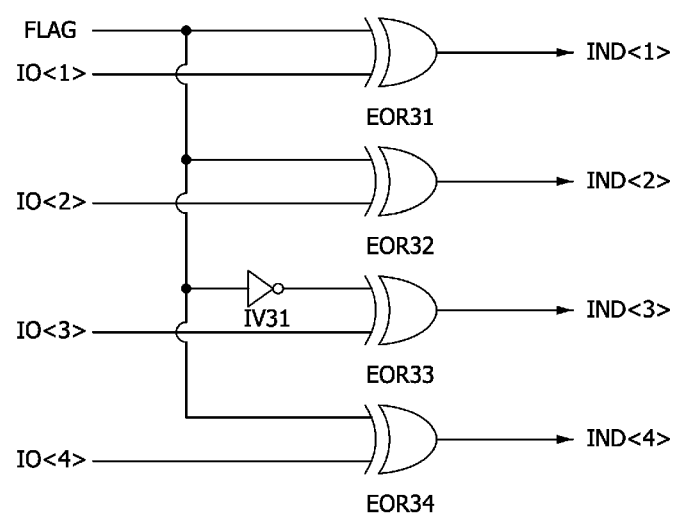
FIG. 8 is a circuit diagram illustrating a representation of an example of the configuration of the first converting part included in the input converting section illustrated in FIG. 7.

Referring to FIG. 8, the first converting part 3211 in accordance with an embodiment may include an inverter IV31 and exclusive OR gates EOR31, EOR32, EOR33 and EOR34.

The exclusive OR gate EOR31 may invert and buffer the first data DQ<1> loaded on the first input/output line IO<1> in the case where the flag signal FLAG is enabled to the logic high level, and output the first input data IND<1>. The exclusive OR gate EOR31 may buffer the first data DQ<1> loaded on the first input/output line IO<1> in the case where the flag signal FLAG is disabled to the logic low level, and output the first input data IND<1>.

The exclusive OR gate EOR32 may invert and buffer the second data DQ<2> loaded on the second input/output line IO<2> in the case where the flag signal FLAG is enabled to the logic high level, and output the second input data IND<2>. The exclusive OR gate EOR32 may buffer the second data DQ<2> loaded on the second input/output line IO<2> in the case where the flag signal FLAG is disabled to the logic low level, and output the second input data IND<2>.

The exclusive OR gate EOR33 may buffer the third data DQ<3> loaded on the third input/output line IO<3> in the case where the flag signal FLAG is enabled to the logic high level, and output the third input data IND<3>. The exclusive OR gate EOR33 may invert and buffer the third data DQ<3> loaded on the third input/output line IO<3> in the case where the flag signal FLAG is disabled to the logic low level, and output the third input data IND<3>.

The exclusive OR gate EOR34 may invert and buffer the fourth data DQ<4> loaded on the fourth input/output line IO<4> in the case where the flag signal FLAG is enabled to the logic high level, and output the fourth input data IND<4>. The exclusive OR gate EOR34 may buffer the fourth data DQ<4> loaded on the fourth input/output line IO<4> in the case where the flag signal FLAG is disabled to the logic low level, and output the fourth input data IND<4>.

For example, in the case where the flag signal FLAG is enabled, the first converting part 3211 may generate the first to fourth input data IND<1:4> by inverting logic levels of the first data DQ<1>, the second data DQ<2> and the fourth data DQ<4> excluding the third data DQ<3> among the first to fourth data DQ<1:4>. The first converting part 3211 may be realized to generate the first to fourth input data IND<1: 4> by converting variously a logic level combination of the first to fourth data DQ<1:4> according to embodiments.

Figure 9:
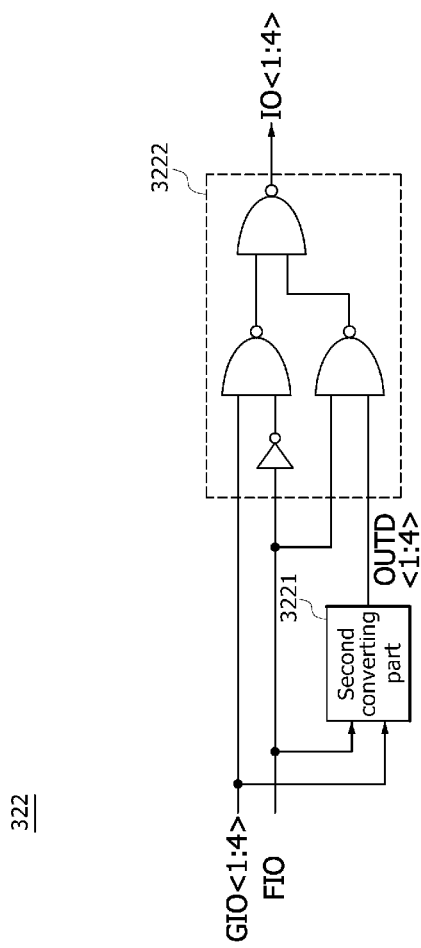
FIG. 9 is a diagram illustrating a representation of an example of the configuration of the output converting section included in the pattern conversion circuit illustrated in FIG. 6.

Referring to FIG. 9, the output converting section 322 in accordance with an embodiment may include a second converting part 3221 and a second buffer part 3222.

The second converting part 3221 may convert a logic level combination of the first to fourth internal data ID<1:4> loaded on the first to fourth global lines GIO<1:4>, in response to the internal flag signal IFL loaded on the flag line FIO, and generate first to fourth output data OUTD<1:4>.

The second buffer part 3222 may buffer the first to fourth internal data ID<1:4> loaded on the first to fourth global lines GIO<1:4> in the case where the internal flag signal IFL is disabled to a logic low level, and output the buffered first to fourth internal data ID<1:4> to the first to fourth input/output lines IO<1:4>. The second buffer part 3222 may buffer the first to fourth output data OUTD<1:4> in the case where the internal flag signal IFL is enabled to a logic high level, and output the buffered first to fourth output data OUTD<1:4> to the first to fourth input/output lines IO<1: 4>.

Figure 10:
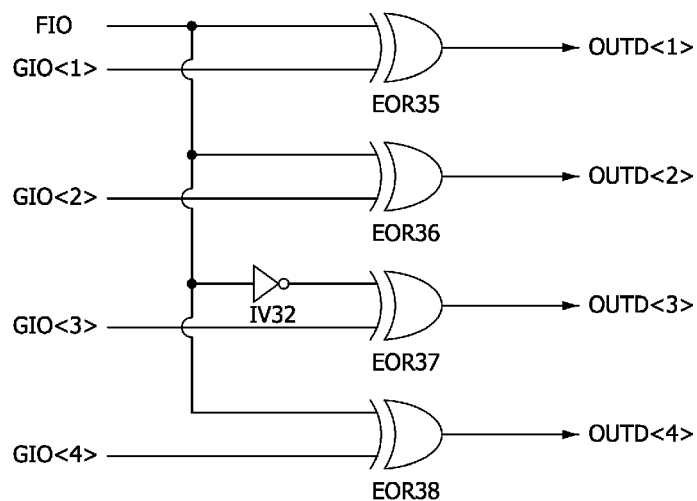
FIG. 10 is a circuit diagram illustrating a representation of an example of the configuration of the second converting part included in the output converting section illustrated in FIG. 9.

Referring to FIG. 10, the second converting part 3221 in accordance with an embodiment may include an inverter IV32 and exclusive OR gates EOR35, EOR36, EOR37 and EOR38.

The exclusive OR gate EOR35 may invert and buffer the first internal data ID<1> loaded on the first global line GIO<1> in the case where the internal flag signal IFL loaded on the flag line FIO is enabled to the logic high level, and output the first output data OUTD<1>. The exclusive OR gate EOR35 may buffer the first internal data ID<1> loaded on the first global line GIO<1> in the case where the internal flag signal IFL is disabled to the logic low level, and output the first output data OUTD<1>.

The exclusive OR gate EOR36 may invert and buffer the second internal data ID<2> loaded on the second global line GIO<2> in the case where the internal flag signal IFL loaded on the flag line FIO is enabled to the logic high level, and output the second output data OUTD<2>. The exclusive OR gate EOR36 may buffer the second internal data ID<2> loaded on the second global line GIO<2> in the case where the internal flag signal IFL is disabled to the logic low level, and output the second output data OUTD<2>.

The exclusive OR gate EOR37 may buffer the third internal data ID<3> loaded on the third global line GIO<3> in the case where the internal flag signal IFL loaded on the flag line FIO is enabled to the logic high level, and output the third output data OUTD<3>. The exclusive OR gate EOR37 may invert and buffer the third internal data ID<3> loaded on the third global line GIO<3> in the case where the internal flag signal IFL is disabled to the logic low level, and output the third output data OUTD<3>.

The exclusive OR gate EOR38 may invert and buffer the fourth internal data ID<4> loaded on the fourth global line GIO<4> in the case where the internal flag signal IFL loaded on the flag line FIO is enabled to the logic high level, and output the fourth output data OUTD<4>. The exclusive OR gate EOR38 may buffer the fourth internal data ID<4> loaded on the fourth global line GIO<4> in the case where the internal flag signal IFL is disabled to the logic low level, and output the fourth output data OUTD<4>.

For example, in the case where the internal flag signal IFL is enabled, the second converting part 3221 may generate the first to fourth output data OUTD<1:4> by inverting logic levels of the first internal data ID<1>, the second internal data ID<2> and the fourth internal data ID<4> excluding the third internal data ID<3> among the first to fourth internal data ID<1:4>. The second converting part 3221 may be realized to have the same configuration as the first converting part 3211 and invert the same bit.

Operations of the semiconductor system in accordance with an embodiment, configured as mentioned above, will be described below with reference to FIGS. 1 to 10, by taking as an example the case where the first data DQ<1> among the bits of the first to fourth data DQ<1:4> is the logic low level and the second to fourth data DQ<2:4> are the logic high level. Descriptions will be made for operations of writing the first to fourth data DQ<1:4> by converting a logic level combination thereof and reading the first to fourth data DQ<1:4> by recovering the logic level combination thereof.

First, the write operation of the semiconductor system will be described below.

The first semiconductor device 1 outputs the commands CS, RAS and CAS, the first to $N^{th}$ addresses ADD<1:N>, and the first to fourth data DQ<1:4>. Only the one first data DQ<1> among the first to fourth data DQ<1:4> is outputted as the logic low level, and the second to fourth data DQ<2:4> are outputted as the logic high level.

The address generation block 10 decodes the commands CS, RAS and CAS and the first to $N^{th}$ addresses ADD<1:N>, and generates the first to $M^{th}$ row addresses RAD<1:M> and the first to $K^{th}$ column addresses CAD<1:K>.

The data input/output block 20 is inputted with the first to fourth data DQ<1:4> and outputs them to first to fourth input/output lines IO<1:4>.

The first detecting section 311 of the pattern detection circuit 31 generates the first pre-flag signal PFL<1> which is enabled to the logic high level, since only the one first data DQ<1> among the bits of the first to fourth data DQ<1:4> is the logic low level.

The second detecting section 312 of the pattern detection circuit 31 generates the second pre-flag signal PFL<2> which is disabled to a logic low level, since only the one first data DQ<1> among the bits of the first to fourth data DQ<1:4> is the logic low level.

The flag signal generating section 313 is inputted with the first pre-flag signal PFL<1> of the logic high level and the second pre-flag signal PFL<2> of the logic low level, and generates the flag signal FLAG which is enabled to the logic high level. The flag signal generating section 313 outputs the flag signal FLAG to the flag line FIO.

The input converting section 321 of the pattern conversion circuit 32 converts a logic level combination of the first to fourth data DQ<1:4> loaded on the first to fourth input/output lines IO<1:4>, in response to the flag signal FLAG of the logic high level, and outputs a converted logic level combination of the first to fourth data DQ<1:4> to the first to fourth global lines GIO<1:4>. The converting of a logic level combination of the first to fourth data DQ<1:4> means that the first data DQ<1> is converted into the logic high level, the second data DQ<2> is converted into the logic low level, the third data DQ<3> is converted into the logic low level and the fourth data DQ<4> is converted into the logic low level.

The sense amplifier 40 outputs the first to fourth data DQ<1:4> loaded on the first to fourth global lines GIO<1:4>, as the first to fourth internal data ID<1:4>, according to the first to $M^{th}$ row addresses RAD<1:M> and the first to $K^{th}$ column addresses CAD<1:K>.

The memory region 50 stores the first to fourth internal data ID<1:4> in memory cells selected according to the first to $M^{th}$ row addresses RAD<1:M> and the first to $K^{th}$ column addresses CAD<1:K>.

The driver 60 generates the internal flag signal IFL of the logic high level in response to the flag signal FLAG of the logic high level inputted through the flag line FIO.

The flag signal storage block 70 stores the internal flag signal IFL.

Next, the read operation of the semiconductor system will be described below.

The first semiconductor device 1 outputs the commands CS, RAS and CAS and the first to $N^{th}$ addresses ADD<1:N>.

The address generation block 10 decodes the commands CS, RAS and CAS and the first to $N^{th}$ addresses ADD<1:N>, and generates the first to $M^{th}$ row addresses RAD<1:M> and the first to $K^{th}$ column addresses CAD<1:K>.

The memory region 50 outputs the first to fourth internal data ID<1:4> of memory cells selected according to the first to $M^{th}$ row addresses RAD<1:M> and the first to $K^{th}$ column addresses CAD<1:K>.

The sense amplifier 40 outputs the first to fourth internal data ID<1:4> to the first to fourth global lines GIO<1:4> according to the first to $M^{th}$ row addresses RAD<1:M> and the first to $K^{th}$ column addresses CAD<1:K>.

The flag signal storage block 70 outputs the internal flag signal IFL of the logic high level.

The driver 60 outputs the internal flag signal IFL to the flag line FIO.

The output converting section 322 of the pattern conversion circuit 32 converts a logic level combination of the first to fourth internal data ID<1:4> loaded on the first to fourth global lines GIO<1:4>, in response to the internal flag signal IFL of the logic high level, and outputs a converted logic level combination of the first to fourth internal data ID<1:4> to the first to fourth input/output lines IO<1:4>. The converting of a logic level combination of the first to fourth internal data ID<1:4> means that the first internal data ID<1> is converted into the logic low level, the second internal data ID<2> is converted into the logic high level, the third internal data ID<3> is converted into the logic high level and the fourth internal data ID<4> is converted into the logic high level.

The data input/output block 20 outputs the first to fourth internal data ID<1:4> loaded on the first to fourth input/output lines IO<1:4>, as the first to fourth data DQ<1:4>. The first to fourth data DQ<1:4> may be outputted to the first semiconductor device 1 or another external device.

In the semiconductor system according to the embodiment, configured as mentioned above, it is possible to write data by converting a logic level combination thereof in the case where only any one among bits of the data is a different logic level and output the data in a read operation by recovering the logic level combination of the data, thereby lessening an interference phenomenon between data bits stored in memory cells. Also, in the semiconductor system according to the embodiment, it is possible to write data by converting a logic level combination thereof in the case where only any one among bits of the data is a different logic level and outputting the data in a read operation by recovering the logic level combination of the data, thereby lessening an inter-symbol interference phenomenon and an inter-channel interference phenomenon.

Figure 11:
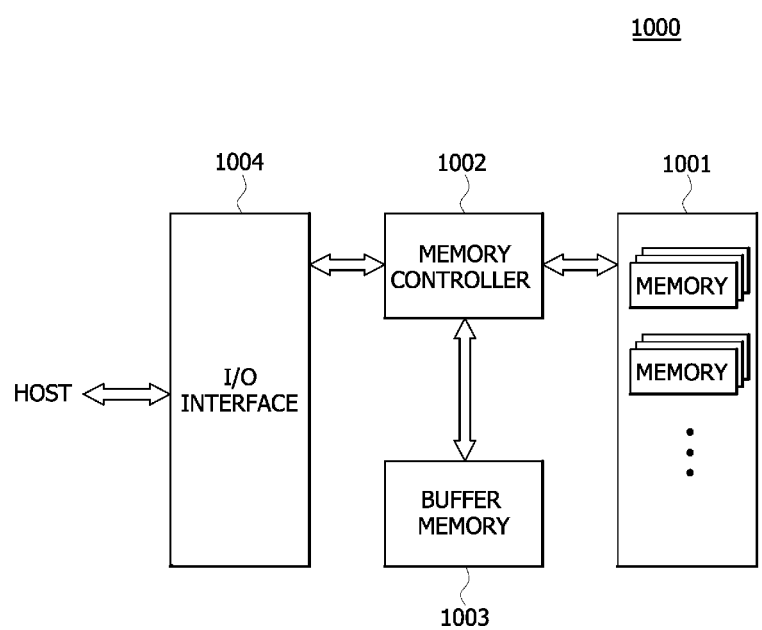
FIG. 11 is a diagram illustrating a representation of an example of the configuration of an electronic system to which the semiconductor devices and the semiconductor system illustrated in FIGS. 1 to 10 are applied.

The semiconductor devices and the semiconductor system described above with reference to FIGS. 1 to 10 may be applied to an electronic system which includes a memory system, a graphic system, a computing system or a mobile system. For example, referring to FIG. 11, an electronic system 1000 in accordance with an embodiment may include a data storage 1001, a memory controller 1002, a buffer memory 1003, and an input/output interface 1004.

The data storage 1001 stores data applied from the memory controller 1002, and reads out stored data and outputs the read-out data to the memory controller 1002, according to control signals from the memory controller 1002. The data storage 1001 may include the second semiconductor device 2 illustrated in FIG. 1. The data storage 1001 may include a nonvolatile memory capable of not losing and continuously storing data even though power supply is interrupted. A nonvolatile memory may be realized as a flash memory such as a NOR flash memory and a NAND flash memory, a phase change random access memory (PRAM), a resistive random access memory (RRAM), a spin transfer torque random access memory (STTRAM) or a magnetic random access memory (MRAM).

The memory controller 1002 decodes commands applied through the input/output interface 1004 from an external device (a host), and controls input/output of data with respect to the data storage 1001 and the buffer memory 1003 according to decoding results. The memory controller 1002 may include the first semiconductor device 1 illustrated in FIG. 1. While the memory controller 1002 is illustrated as one block in FIG. 11, in the memory controller 1002, a controller for controlling the nonvolatile memory and a controller for controlling the buffer memory 1003 as a volatile memory may be independently configured.

The buffer memory 1003 may temporarily store data to be processed in the memory controller 1002, that is, data to be inputted and outputted to and from the data storage 1001. The buffer memory 1003 may store data applied from the memory controller 1002 according to a control signal. The buffer memory 1003 reads out stored data and outputs the read-out data to the memory controller 1002. The buffer memory 1003 may include a volatile memory such as a DRAM (dynamic random access memory), a mobile DRAM and an SRAM (static random access memory).

The input/output interface 1004 provides a physical coupling between the memory controller 1002 and the external device (the host) such that the memory controller 1002 may receive control signals for input/output of data from the external device and exchange data with the external device. The input/output interface 1004 may include one among various interface protocols such as USB, MMC, PCI-E, SAS, SATA, PATA, SCSI, ESDI and IDE.

The electronic system 1000 may be used as an auxiliary memory device or an external storage device of the host. The electronic system 1000 may include a solid state disk (SSD), a USB memory (universal serial bus memory), a secure digital (SD) card, a mini-secure digital (mSD) card, a micro SD card, a secure digital high capacity (SDHC) card, a memory stick card, a smart media (SM) card, a multimedia card (MMC), an embedded MMC (eMMC), or a compact flash (CF) card.

While various embodiments have been described above, it will be understood to those skilled in the art that the embodiments described are by way of example only. Accordingly, the semiconductor device and the semiconductor system described herein should not be limited based on the described embodiments.

What is claimed is:

1. A semiconductor system comprising:
 a first semiconductor device configured to output commands, addresses and data; and
 a second semiconductor device configured to convert a logic level combination of the data in response to a flag signal which is enabled in the case where only any one of bits of the data is a different logic level, and store the data in response to the commands and the addresses, in a write operation.

2. The semiconductor system according to claim 1, wherein the second semiconductor device stores the data without converting the logic level combination of the data when two or more of the bits of the data are at the same logic level, in the write operation.

3. The semiconductor system according to claim 1, wherein the second semiconductor device outputs the stored data by recovering the logic level combination of the stored data, in response to an internal flag signal which is generated from the flag signal, in a read operation.

4. The semiconductor system according to claim 1, wherein the second semiconductor device comprises:
 an address generation block configured to decode the commands and the addresses, and generate row addresses and column addresses;
 a data input/output block configured to output the data to input/output lines in the write operation, and output internal data loaded on the input/output lines, as the data, in the read operation;
 a pattern control block configured to output the data loaded on the input/output lines to global lines by converting the logic level combination of the data or output the data loaded on the input/output lines to the global lines, in the write operation, and output the internal data loaded on the global lines to the input/output lines by recovering a logic level combination of the internal data, in the read operation;
 a sense amplifier configured to generate the internal data in response to the data loaded on the global lines according to the row addresses and the column addresses, in the write operation, and output the internal data to the global lines, in the read operation; and
 a memory region configured to store the internal data in memory cells selected according to the row addresses and the column addresses, in the write operation, and output the internal data stored in the memory cells selected according to the row addresses and the column addresses, in the read operation.

5. The semiconductor system according to claim 4, wherein the pattern control block comprises:
   a pattern detection circuit configured to detect the logic level combination of the data loaded on the input/output lines, and generate the flag signal; and
   a pattern conversion circuit configured to output the data loaded on the input/output lines to the global lines by converting the logic level combination of the data or output the data to the global lines, in response to the flag signal, in the write operation.

6. The semiconductor system according to claim 5, wherein the pattern conversion circuit outputs the internal data loaded on the global lines to the input/output lines by converting the logic level combination of the internal data or output the internal data to the input/output lines, in response to an internal flag signal which is generated from the flag signal, in the read operation.

7. The semiconductor system according to claim 5, wherein the pattern detection circuit comprises:
   a first detecting section configured to generate a first pre-flag signal which is enabled when any one of the bits of the data loaded on the input/output lines is a first logic level;
   a second detecting section configured to generate a second pre-flag signal which is enabled when any one of the bits of the data loaded on the input/output lines is a second logic level; and
   a flag signal generating section configured to generate the flag signal which is enabled when any one of the first pre-flag signal and the second pre-flag signal is enabled.

8. The semiconductor system according to claim 5, wherein the pattern conversion circuit comprises:
   an input converting section configured to output the data loaded on the input/output lines to the global lines by converting the logic level combination of the data or output the data loaded on the input/output lines to the global lines, in response to the flag signal, in the write operation; and
   an output converting section configured to output the internal data loaded on the global lines to the input/output lines by converting the logic level combination of the internal data or output the internal data loaded on the global lines to the input/output lines, in response to the internal flag signal loaded on a flag line, in the read operation.

9. The semiconductor system according to claim 8, wherein the input converting section comprises:
   a first converting part configured to generate input data by converting the logic level combination of the data loaded on the input/output lines, in response to the flag signal; and
   a first buffer part configured to buffer the data loaded on the input/output lines and output the buffered data to the global lines or buffer the input data and output the buffered input data to the global lines, in response to the flag signal.

10. The semiconductor system according to claim 8, wherein the output converting section comprises:
    a second converting part configured to generate output data by converting the logic level combination of the internal data loaded on the global lines, in response to the internal flag signal; and
    a second buffer part configured to buffer the internal data loaded on the global lines and output the buffered internal data to the input/output lines or buffer the output data and output the buffered output data to the input/output lines, in response to the internal flag signal.

11. The semiconductor system according to claim 4, further comprising:
    a driver configured to generate the internal flag signal in response to the flag signal loaded on the flag line in the write operation, and output the internal flag signal to the flag line in the read operation; and
    a flag signal storage block configured to store the internal flag signal in the write operation, and output the internal flag signal in the read operation.

12. A semiconductor device comprising:
    a data input/output block configured to output data inputted from an exterior, to input/output lines, in a write operation, and output internal data loaded on the input/output lines, as the data, in a read operation; and
    a pattern control block configured to output the data loaded on the input/output lines to global lines by converting a logic level combination of the data, when only any one of bits of the data is a different logic level, and output the internal data loaded on the global lines to the input/output lines by recovering a logic level combination of the internal data, in the read operation.

13. The semiconductor device according to claim 12, wherein the pattern control block is configured to output the data loaded on the input/output lines to the global lines by converting the logic level combination of the data, in response to a flag signal which is enabled when only any one of the bits of the data is at the different logic level.

14. The semiconductor device according to claim 12, wherein the pattern control block outputs the data to the global lines without converting the logic level combination of the data when two or more of the bits of the data are at the same logic level, in the write operation.

15. The semiconductor device according to claim 13, wherein the pattern control block comprises:
    a pattern detection circuit configured to detect the logic level combination of the data loaded on the input/output lines, and generate the flag signal; and
    a pattern conversion circuit configured to output the data loaded on the input/output lines to the global lines by converting the logic level combination of the data or output the data to the global lines, in response to the flag signal, in the write operation.

16. The semiconductor device according to claim 15, wherein the pattern conversion circuit outputs the internal data loaded on the global lines to the input/output lines by converting the logic level combination of the internal data or output the internal data to the input/output lines, in response to an internal flag signal which is generated from the flag signal, in the read operation.

17. The semiconductor device according to claim 13, wherein the pattern detection circuit comprises:
    a first detecting section configured to generate a first pre-flag signal which is enabled when any one of the bits of the data loaded on the input/output lines is a first logic level;
    a second detecting section configured to generate a second pre-flag signal which is enabled when any one of the bits of the data loaded on the input/output lines is a second logic level; and a flag signal generating section configured to generate the flag signal which is enabled when any one of the first pre-flag signal and the second pre-flag signal is enabled.

18. The semiconductor device according to claim 13, wherein the pattern conversion circuit comprises:
    an input converting section configured to output the data loaded on the input/output lines to the global lines by converting the logic level combination of the data or output the data loaded on the input/output lines to the global lines, in response to the flag signal, in the write operation; and
    an output converting section configured to output the internal data loaded on the global lines to the input/output lines by converting the logic level combination of the internal data or output the internal data loaded on the global lines to the input/output lines, in response to the internal flag signal loaded on a flag line, in the read operation.

19. The semiconductor device according to claim 18, wherein the input converting section comprises:
    a first converting part configured to generate input data by converting the logic level combination of the data loaded on the input/output lines, in response to the flag signal; and
    a first buffer part configured to buffer the data loaded on the input/output lines and output the buffered data to the global lines or buffer the input data and output the buffered input data to the global lines, in response to the flag signal.

20. The semiconductor device according to claim 18, wherein the output converting section comprises:
    a second converting part configured to generate output data by converting the logic level combination of the internal data loaded on the global lines, in response to the internal flag signal; and
    a second buffer part configured to buffer the internal data loaded on the global lines and output the buffered internal data to the input/output lines or buffer the output data and output the buffered output data to the input/output lines, in response to the internal flag signal.

21. The semiconductor device according to claim 13, further comprising:
    a sense amplifier configured to generate the internal data in response to the data loaded on the global lines according to row addresses and column addresses, in the write operation, and output the internal data to the global lines, in the read operation;
    a memory region configured to store the internal data in memory cells selected according to the row addresses and the column addresses, in the write operation, and output the internal data stored in the memory cells selected according to the row addresses and the column addresses, in the read operation;
    a driver configured to generate the internal flag signal in response to the flag signal loaded on the flag line in the write operation, and output the internal flag signal to the flag line in the read operation; and
    a flag signal storage block configured to store the internal flag signal in the write operation, and output the internal flag signal in the read operation.

* * * * *